(12) United States Patent
Morino

(10) Patent No.: US 7,885,048 B2
(45) Date of Patent: Feb. 8, 2011

(54) SEMICONDUCTOR DEVICE AND AN ELECTRONIC APPARATUS INCORPORATING THE SEMICONDUCTOR DEVICE

(75) Inventor: Koichi Morino, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 512 days.

(21) Appl. No.: 11/715,888

(22) Filed: Mar. 9, 2007

(65) Prior Publication Data

US 2007/0216461 A1    Sep. 20, 2007

(30) Foreign Application Priority Data

Mar. 15, 2006    (JP)    .............................. 2006-070907

(51) Int. Cl.
*H02H 5/04*    (2006.01)
*H02H 3/08*    (2006.01)
*H01H 47/28*    (2006.01)
*H01H 47/32*    (2006.01)
*G08B 17/00*    (2006.01)
*G08B 17/04*    (2006.01)

(52) U.S. Cl. .................. 361/93.8; 361/93.1; 361/169.1; 361/187; 361/117; 340/584; 340/595

(58) Field of Classification Search ................ 361/93.8, 361/93.1, 169.1, 187; 307/117; 340/584, 340/595

See application file for complete search history.

(56) References Cited

U.S. PATENT DOCUMENTS

| | | | | |
|---|---|---|---|---|
| 5,568,347 A * | 10/1996 | Shirai et al. | .................... | 361/98 |
| 6,373,671 B1 * | 4/2002 | Watanabe et al. | .......... | 361/93.8 |
| 6,381,286 B1 * | 4/2002 | Wilkinson et al. | .......... | 375/296 |
| 6,934,139 B2 * | 8/2005 | Kumagai et al. | ............ | 361/103 |

FOREIGN PATENT DOCUMENTS

| | | |
|---|---|---|
| JP | 2002-108465 | 4/2002 |
| JP | 2002-232280 | 8/2002 |
| JP | 2005-122753 | 5/2005 |
| JP | 2005-347377 | 12/2005 |

* cited by examiner

*Primary Examiner*—Jared Fureman
*Assistant Examiner*—Lucy Thomas
(74) *Attorney, Agent, or Firm*—Dickstein Shapiro LLP

(57) ABSTRACT

A semiconductor device and an electronic apparatus incorporating the semiconductor device are disclosed. The semiconductor device includes a power circuit that further includes a power transistor for providing current to a load (load current), a temperature detector for detecting the temperature of the power transistor, and a current detector for detecting the load current. If the detected temperature of the power transistor reaches a first predetermined temperature, and if the detected load current exceeds a first predetermined load current, a signal is output through an external terminal of the semiconductor device.

10 Claims, 4 Drawing Sheets

SEMICONDUCTOR DEVICE AND AN ELECTRONIC APPARATUS INCORPORATING THE SEMICONDUCTOR DEVICE

BACKGROUND OF THE INVENTION

1. Field of the Invention

The present invention generally relates to a semiconductor device capable of coping with overheating and an over-current by providing a temperature detector and a current detector; and especially relates to a semiconductor device that includes a power circuit capable of sending out an alarm signal to an external circuit before abnormalities occur in the power circuit, and an electronic apparatus, such as a cellular phone, incorporating the semiconductor device.

2. Description of the Related Art

Background Technique

A semiconductor device that includes a power circuit for supplying a current to a load uses a power transistor for controlling an output voltage and a load current. Such a semiconductor device generates heat in connection with a large current flowing through the power transistor. In order to reduce the heat generated, conventionally, a current limitation circuit is widely used.

Here, the temperature of the semiconductor device is dependent on consumed electric power and the ambient temperature. Accordingly, if, for example, the ambient temperature is low, and/or if an electric voltage applied to the power transistor is low, a current greater than dictated by the current limitation circuit may be allowed to flow. On the contrary, there can be a case wherein the temperature of the semiconductor device exceeds a maximum rating before the current limitation circuit triggers. That is, protection of the semiconductor device cannot be adequately provided only by the current limitation circuit.

For this reason, conventionally, an overheat-protection circuit for limiting the current of the power transistor is additionally used, wherein a temperature sensing element is arranged in the vicinity of the power transistor for determining whether the temperature of the vicinity of the power transistor reaches a predetermined temperature.

Further, where the semiconductor device includes two or more power circuits for supplying power to different loads of a system, one of the power circuits may stop power supply due to an over-current and overheating, which causes a breakdown of the system.

In an attempt to cope with the situation as described above, Patent Reference 1 discloses a technique of identifying a power circuit causing unusual generation of heat, and selectively carrying out protection control.

According to the technique, a semiconductor chip including two or more power circuits and a microprocessor constitute a hybrid IC; a temperature detector is built into the semiconductor chip and is densely thermally coupled with a power transistor of a power circuit; if a temperature detected by the temperature detector exceeds a predetermined temperature threshold, the microprocessor turns off a power transistor of the power circuit, the flowing current of which exceeds a predetermined current value.

[Patent reference 1] JPA 2002-232280

DISCLOSURE OF THE INVENTION

Object of the Invention

Nevertheless, the technique disclosed by Patent Reference 1 essentially offers the over-current protection and overheat protection with directions of the microprocessor, which over-current protection and overheat protection are the same as those conventionally provided within each power circuit. That is, Patent Reference 1 does not provide for a measure of a situation wherein the system is suddenly stopped by the defective power transistor being turned off for protection.

SUMMARY OF THE INVENTION

The present invention provides a semiconductor device and an electronic apparatus incorporating the semiconductor device that substantially obviate one or more of the problems caused by the limitations and disadvantages of the related art.

Specifically, the present invention provides a semiconductor device that is capable of identifying the location of abnormalities in the semiconductor device. Further, if the semiconductor device includes two or more power circuits, a power circuit that has abnormalities can be identified. Further, the semiconductor device is capable of providing suitable measures before turning off the defective power transistor. Further, the present invention provides an electronic apparatus that includes the semiconductor device.

Features of embodiments of the present invention are set forth in the description that follows, and in part will become apparent from the description and the accompanying drawings, or may be learned by practice of the invention according to the teachings provided in the description. Problem solutions provided by an embodiment of the present invention may be realized and attained by a semiconductor device and an electronic apparatus incorporating the semiconductor device particularly pointed out in the specification in such full, clear, concise, and exact terms as to enable a person having ordinary skill in the art to practice the invention.

To achieve these solutions and in accordance with an aspect of the invention as embodied and broadly described herein, an embodiment of the invention provides a semiconductor device and an electronic apparatus incorporating the semiconductor device as follows.

Means for Solving a Subject

A semiconductor device according to an aspect of the embodiment of the present invention includes a temperature detector and a current detector for identifying an unusual part and for providing suitable measures based on each detection value.

According to an aspect of the embodiment, the temperature detector detects the temperature in the vicinity of a predetermined circuit of the semiconductor device, and the current detector detects the current that flows through the predetermined circuit; if the detected temperature reaches a first predetermined temperature, and if the current detected is greater a first predetermined load current, a signal is provided to an external terminal of the semiconductor device; and the signal is provided to a controlling unit. In this way, the signal warns of an imminent power-off before the defective power circuit is actually turned off so that suitable measures can be taken.

A semiconductor according to another aspect of the embodiment includes a power circuit that includes a power transistor for providing power to a load, a temperature detector for detecting the temperature of the power transistor, and a current detector for detecting a load current. Therein, if the detected temperature of the power transistor reaches the first predetermined temperature, and if the load current reaches the first predetermined load current, a signal is provided to an external terminal of the semiconductor. Then, the signal is provided to a controlling unit. In this way, the signal warns of an imminent power-off before the defective power circuit is actually turned off so that suitable measures can be taken.

According to an aspect of the embodiment, a second predetermined temperature that is higher than the first predetermined temperature is defined, and the temperature detector turns off the power transistor if the temperature of the power transistor reaches the second predetermined temperature so that the power transistor is protected from destruction.

According to an aspect of the embodiment, a second predetermined load current that is greater than the first predetermined load current is defined, and the current detector reduces an output voltage of the power circuit if the load current exceeds the second predetermined load current. In this way, the power circuit and the load are protected from damage even if measures by the controlling unit cannot be taken in time, and even if a situation beyond anticipation happens. Further, the embodiment provides specific exemplary realizations of the temperature detector and the current detector.

According to another aspect of the embodiment, the semiconductor device includes two or more power circuits, wherein an abnormal power circuit is identified so that the controlling unit can take measures for the identified power circuit.

Another aspect of the embodiment provides an electronic apparatus such as a cellular phone that includes the semiconductor device as described above. Accordingly, abnormalities of the power circuit of the electronic apparatus are determined in advance, and suitable measures can be taken to prevent damage of the power transistor and failure of the power source.

EFFECTIVENESS OF INVENTION

According to the embodiment of the present invention, before the overheat protection and the over-current protection are triggered at the second level (the second predetermined temperature and the second predetermined load current), the warning signal (the signal described above) is output if the detected temperature and the detected load current reach the first level (the first predetermined temperature and the first predetermined load current) that are somewhat less than the second level. In this way, the controlling unit can take measures (such as reducing the load current of the power circuit wherein abnormalities are likely to occur and making adjustment with a related circuit) before the overheat protection and the over-current protection take place. Accordingly, a problem due to sudden loss of the power is avoided.

Further, in the case wherein the semiconductor device includes two or more power circuits, a power circuit wherein abnormalities are likely to occur can be identified by taking a logical "AND" of the temperature and the load current.

DESCRIPTION OF THE PREFERRED EMBODIMENTS

In the following, embodiments of the present invention are described with reference to the accompanying drawings.

Figure 1:
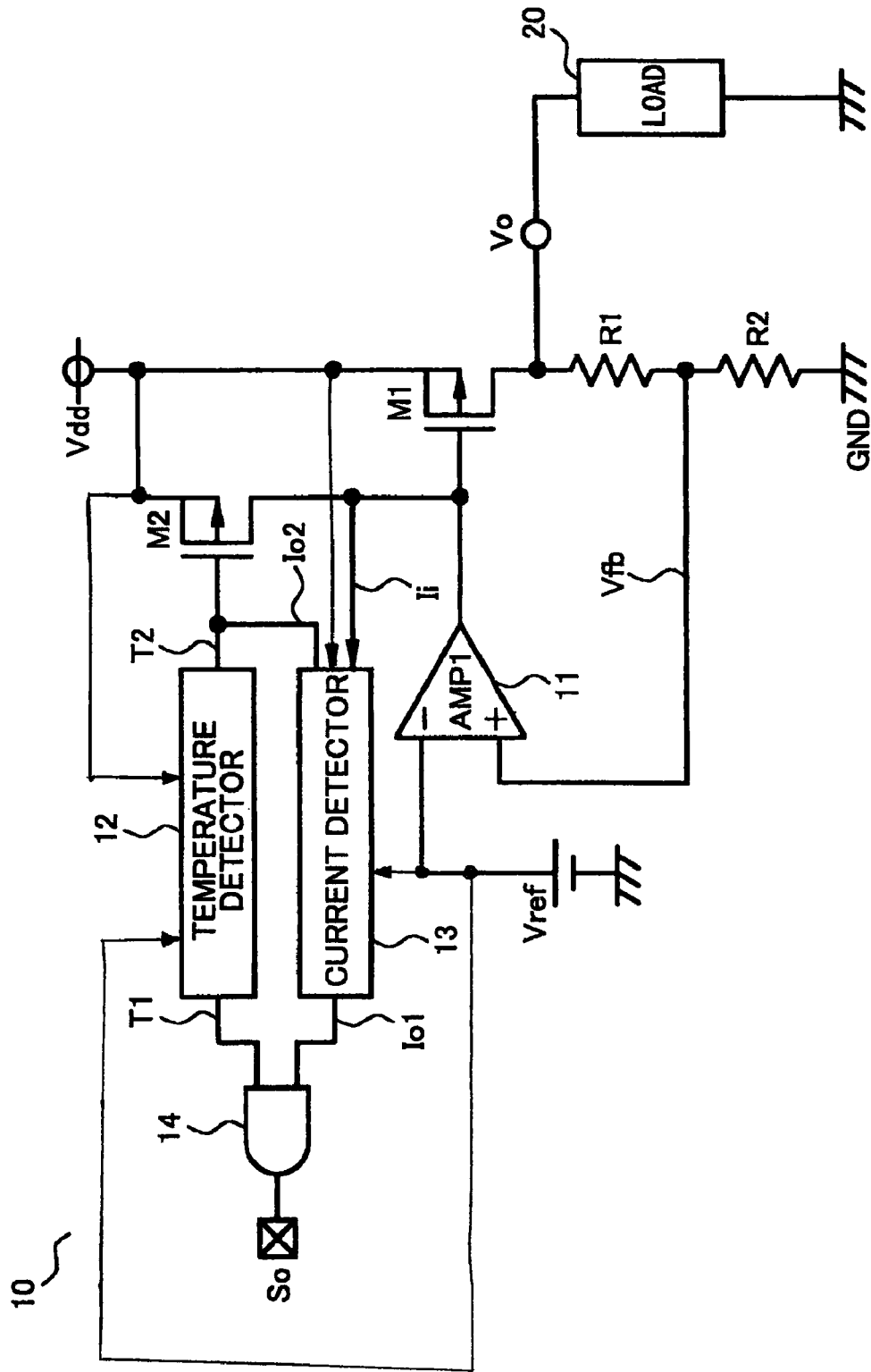
FIG. 1 is a circuit diagram of a power circuit according to the embodiment of the present invention.

FIG. 1 is a circuit diagram of a power circuit 10 according to the embodiment of the present invention. The power circuit 10 includes a reference voltage Vref, an error amplifying circuit 11, a temperature detector 12, a current detector 13, an "AND" circuit 14, a power transistor M1, a PMOS transistor M2, resistors R1 and R2, an output terminal Vo, and an external terminal So. Further, a load 20 is connected to the output terminal Vo.

The power transistor M1 is a PMOS transistor where a drain is connected to a power source Vdd, a source is connected to the output terminal Vo, and the source is further connected to ground potential (another power source) GND through the resistors R1 and R2 that are connected in series.

The reference voltage Vref is connected to an inverting input of the error amplifying circuit 11, and a voltage Vfb that is a divided voltage of the output voltage Vo divided by the resistors R1 and R2 is connected to a non-inverting input of the error amplifying circuit 11. Further, an output of the error amplifying circuit 11 is connected to a gate of the power transistor M1.

A drain of the PMOS transistor M2 is connected to the power source Vdd, and a source of the PMOS transistor M2 is connected to the gate of the power transistor M1. Further, an output T2 of the temperature detector 12 and an output Io2 of the current detector 13 are connected to a gate of the PMOS transistor M2.

Another output T1 of the temperature detector 12 is connected to one of input terminals of the "AND" circuit 14.

Another output Io1 of the current detector 13 is connected to the other input terminal of the "AND" circuit 14, and an input Ii is connected to the gate of the power transistor M1.

Figure 2:
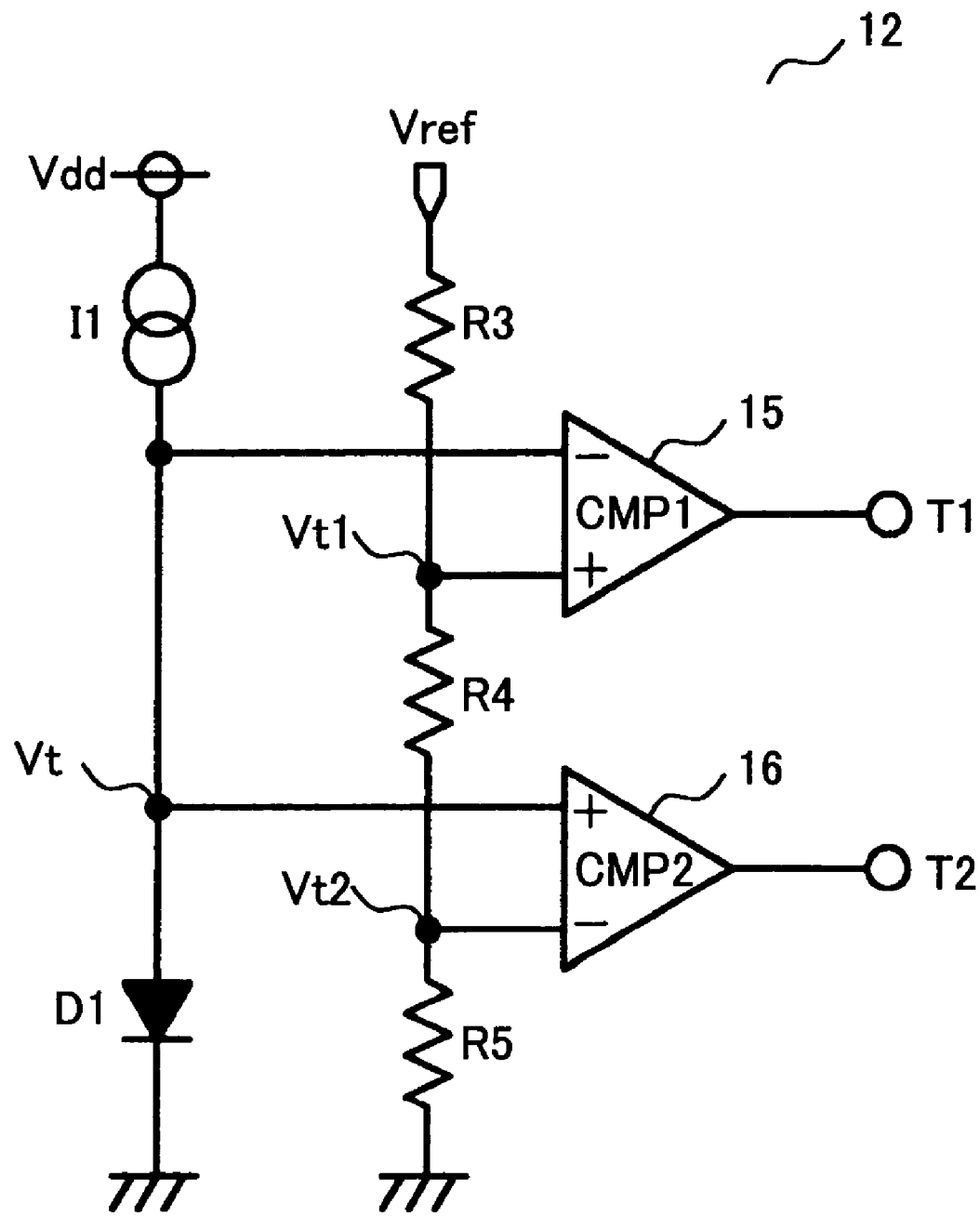
FIG. 2 is a circuit diagram of a temperature detector according to the embodiment of the present invention.

FIG. 2 shows details of the temperature detector 12. The temperature detector 12 includes two comparators 15 and 16, a diode D1 for temperature detection, a current source I1, and resistors R3 through R5.

The current source I1 and the diode D1 are connected in series between the power source Vdd and ground potential GND. Further, the resistors R1 through R3 are connected in series, and the reference voltage Vref is applied to the serial connection.

An anode voltage Vt of the diode D1 is provided to an inverting input of the comparator 15, and to a non-inverting input of the comparator 16. A voltage Vt1 at a point where the resistors R3 and R4 are connected is applied to a non-inverting input of the comparator 15. A voltage Vt2 at a point where the resistors R4 and R5 are connected is applied to an inverting input of the comparator 16.

An output T1 of the comparator 15 serves as the output T1 of the temperature detector 12, and an output T2 of the comparator 16 serves as the output T2 of the temperature detector 12.

Figure 3:
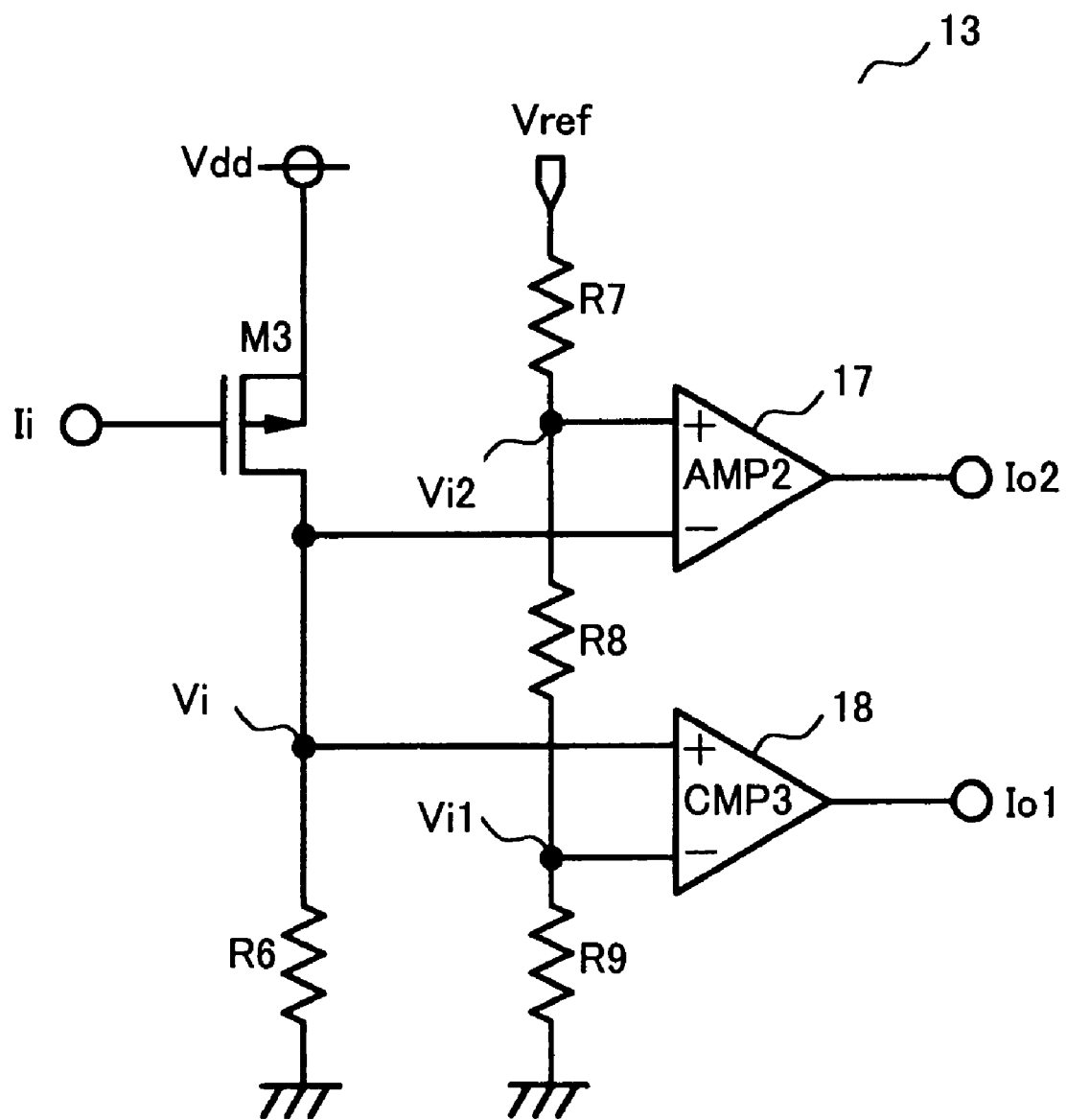
FIG. 3 is a circuit diagram of a current detector according to the embodiment of the present invention.

FIG. 3 shows details of the current detector 13. The current detector 13 includes an operational amplifying circuit 17, a comparator 18, a PMOS transistor M3, and resistors R6 through R9.

The PMOS transistor M3 and the resistor R6 are connected in series between the power source Vdd and the ground voltage GND. Further, the resistors R7 through R9 are connected in series, and the reference voltage Vref is applied to the serial connection.

Since the gate of the PMOS transistor M3 is connected to the gate of the power transistor M1, a drain current of the PMOS transistor M3 is equal to a drain current of the power transistor M1, wherein the drain current is proportional to a load current.

The voltage Vi at a junction of the PMOS transistor M3 and the resistor R6 is applied to an inverting input of the operational amplifying circuit 17 and a non-inverting input of the comparator 18. The voltage Vi2 at the junction of the resistors R7 and R8 is applied to a non-inverting input of the operational amplifying circuit 17. The voltage Vi1 at the junction of the resistors R8 and R9 is applied to an inverting input of the comparator 18.

An output of the operational amplifying circuit 17 serves as the output Io2 of the current detector 13. An output of the comparator 18 serves as the output Io1 of the current detector 13.

Figure 4:
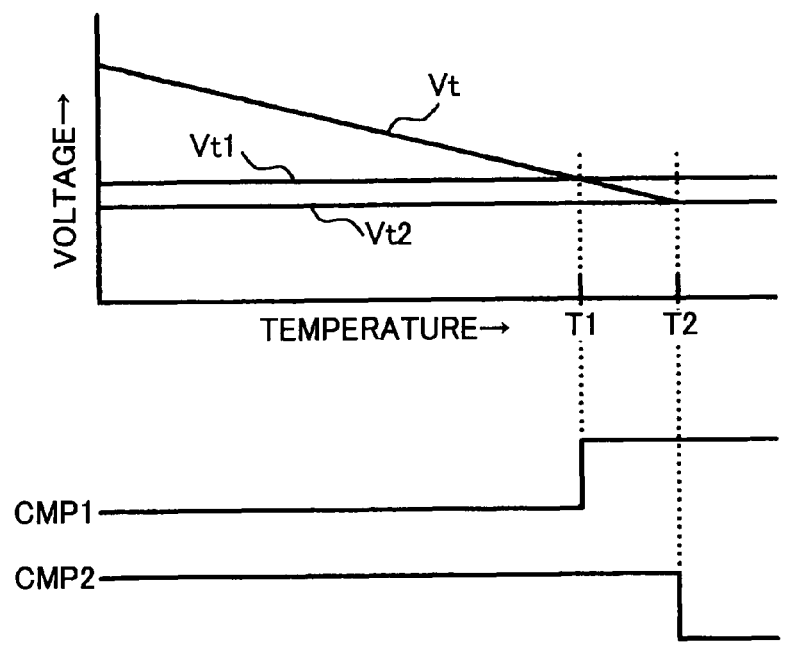
FIG. 4 is a graph showing operations of the temperature detector.
Figure 5:
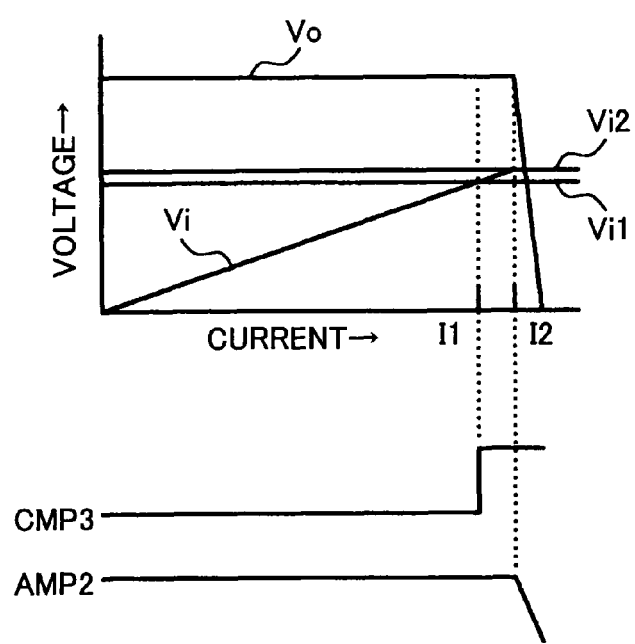
FIG. 5 is a graph showing operations of the current detector.

FIG. 4 is a graph for explaining operations of the temperature detector 12, and FIG. 5 is for explaining operations of the current detector 13.

Hereafter, the operations of the circuits shown by FIGS. 1 through 3 are explained with reference to FIG. 4 and FIG. 5.

Where the temperature is low, a voltage drop of the diode D1 (FIG. 2) for temperature detection is great. Accordingly, the voltage Vt is greater than the voltage Vt1 that is the divided voltage of the reference voltage Vref. As a result, the output of the comparator 15 is a low level (LOW), and the output of the comparator 16 is high-level (HIGH). Accordingly, the output T1 of the temperature detector 12 is LOW, and the output T2 is HIGH.

Consequently, if the output of the current detector 13 is disregarded, the PMOS transistor M2 is turned off (OFF), and the output of the "AND" circuit 14, (i.e., the output to the external terminal So) is LOW.

As the temperature rises, a forward voltage of the diode D1 decreases. If the temperature exceeds the temperature T1 (FIG. 4), the voltage Vt becomes less than the voltage Vt1, and the output of the comparator 15 becomes HIGH. However, the output of the comparator 16 stays HIGH. That is, the output T1 of the temperature detector 12 is HIGH, and the output T2 is HIGH.

Consequently, although the PMOS transistor M2 is still OFF, since one input of the "AND" circuit 14 becomes HIGH, the level of the output of the "AND" circuit 14 (i.e., the terminal So) is determined by the level of the output Io1 of the current detector 13.

If the temperature further rises and exceeds the temperature T2 (FIG. 4), the voltage Vt becomes less than the voltage Vt2. As a result, the output of the comparator 15 is HIGH and the output of the comparator 16 becomes LOW. Consequently, the output T1 of the temperature detector 12 becomes HIGH, and the output T2 becomes LOW.

Consequently, the PMOS transistor M2 is turned on (ON), the gate electric voltage of the power transistor M1 is pulled up, the power transistor M1 is turned off (OFF), and supply of the load current is stopped. In addition, one input of the "AND" circuit 14 is still HIGH, so that the output of the "AND" circuit (i.e., the external terminal So) is determined by the level of the output Io1 of the current detector 13.

When the load current is small, a voltage drop across the resistor R6 is small given that the drain current of the PMOS transistor M2 is proportional to the load current. The voltage drop across the resistor R6 is less than the voltage Vi1 that is the divided voltage of the reference voltage Vref. As a result, the output of the comparator 18 is LOW, the output of the operational amplifying circuit 17 is HIGH, the output Io1 of the current detector 13 is LOW, and the output Io2 is HIGH.

Consequently, if the output of the temperature detector 12 is disregarded, the PMOS transistor M2 is OFF, and the output of the "AND" circuit 14 at the external terminal So is LOW. If the load current increases and exceeds the load current I1 (FIG. 5), the voltage drop Vi of the resistor R6 becomes greater than the voltage Vi1. Then, the output of the comparator 18 becomes HIGH. In addition, the output of the operational amplifying circuit 17 is still HIGH. That is, the output Io1 of the current detector 13 is HIGH and the output Io2 is HIGH.

Consequently, although the PMOS transistor M2 is still OFF, since the input Io1 provided to the "AND" circuit 14 becomes HIGH, the output level of the "AND" circuit 14 at the external terminal So is determined by the output T1 of the temperature detector 12.

If the load current further increases and exceeds the load current I2 (FIG. 5), the voltage drop Vi of the resistor R6 exceeds the voltage Vi2. Then, although the output Io1 of the comparator 18 is still HIGH, since the output Io2 of the operational amplifying circuit 17 is decreased, the gate voltage of the PMOS transistor M2 is decreased, the impedance of the PMOS transistor M2 is decreased, and the gate voltage of the power transistor M1 is pulled up, the output voltage Vo is decreased and the over-current protection takes place as shown in FIG. 5.

As described above, although the temperature detector 12 and the current detector 13 independently protect the power circuit 10, before either starts the protection function, the inputs provided to the "AND" circuit 14 are HIGH. That is, with the temperature rise, if the voltage Vt becomes less than the voltage Vt1, the load current is increased, and a voltage Vi exceeds the voltage Vi1, the output of the "AND" circuit 14 becomes HIGH, although the protection function is not started.

The output of the "AND" circuit 14 is provided to a controlling unit, such as a CPU, prepared outside of the semiconductor device through the external terminal So. If the external terminal So becomes HIGH, the controlling unit is arranged to take suitable measures before the protection function of the power circuit 10 is triggered so that other circuits may not be affected even if the load currently supplied from the power circuit 10 is reduced, and the output voltage of the power circuit 10 is decreased or turned off by the protection function.

Where the semiconductor device includes two or more power circuits 10, the controlling circuit identifies a power circuit 10 that is likely to pose a problem by monitoring the signal level at the external terminal So of each power circuit 10. In this way, suitable measures can be taken in advance of the problem occurring.

Further, since the semiconductor chip is small, the temperature detector 12 is affected by heat from power transistors other than the target power transistor. Therefore, the alarm signal is provided through the external terminal So only when the load current of the target power transistor is greater than a predetermined current value. In this way, the power circuit that is likely to pose a problem is reliably identified.

Further, an electrical apparatus, such as a cellular phone, where the power circuit is appropriately protected is realized by building the semiconductor device into the electrical apparatus.

In addition, although the embodiment describes a semiconductor device that includes the power circuit, the present invention can be generally applied to other cases. For example, a part of a circuit that may pose a problem can be identified by detecting a temperature and a current of more than one part with one or more temperature detectors and current detectors of the semiconductor device; then, measures can be taken in advance, and a great current flowing through the identified part of the circuit can be stopped.

Further, the present invention is not limited to these embodiments, but variations and modifications may be made without departing from the scope of the present invention.

The present application is based on Japanese Priority Application No. 2006-070907 filed on Mar. 15, 2006 with the Japanese Patent Office, the entire contents of which are hereby incorporated by reference.

What is claimed is:

1. A semiconductor device, comprising:
   a temperature detector for detecting a temperature of a vicinity of a target circuit; and
   a current detector for detecting a current that flows through the target circuit;
   wherein a warning signal is output from an external terminal of the semiconductor device when the detected temperature reaches a first predetermined temperature, and the detected current is greater than a first predetermined load current, and
   wherein the current that flows through the target circuit is cut off when the detected temperature reaches a second predetermined temperature that is defined as being higher than the first predetermined temperature,
   an output voltage of the target circuit is decreased when the detected load current exceeds a second predetermined load current that is defined as being greater than the first predetermined load current, and
   the external terminal is arranged to output the warning signal directly to an external controller of a control system having different loads, and the warning signal is different than a signal cutting off current that flows through the target circuit.

2. The semiconductor device of claim 1, wherein
   a signal is provided to a current modification unit when the detected temperature reaches the first predetermined temperature, and the detected current is greater than the first predetermined load current.

3. The semiconductor device of claim 2, wherein
   said signal changes when the detected temperature reaches a second predetermined temperature or when the detected current is greater than a second predetermined load current.

4. A semiconductor device, comprising:
   a power circuit that includes
      a power transistor for providing a load current that is a current to a load;
      a temperature detector for detecting a temperature of the power transistor; and
      a current detector for detecting the load current;
   wherein the power circuit outputs a signal through an external terminal of the semiconductor device when the detected temperature of the power transistor reaches a first predetermined temperature, and the detected load current is greater than a first predetermined load current, and
   wherein the power transistor of the power circuit is turned off when the detected temperature reaches a second predetermined temperature that is defined as being higher than the first predetermined temperature,
   an output voltage of the power circuit is decreased when the detected load current exceeds a second predetermined load current that is defined as being greater than the first predetermined load current, and
   the semiconductor device is arranged to output the signal through the external terminal directly to an external controller of a control system having different loads, and the signal through the external terminal is different than a signal controlling a gate of the power transistor.

5. The semiconductor device as claimed in claim 4, wherein the temperature detector comprises:
   a current source and a diode for temperature detection that are connected in series between a first power source and a second power source;
   a first resistor, a second resistor, and a third resistor that are connected in series between a source of a reference voltage and the second power source;
   a first comparator wherein a voltage at a junction of the current source and the diode for temperature detection is provided to an inverting input, a voltage at a junction of the first resistor and the second resistor is provided to a non-inverting input, and a signal is output when the detected temperature is equal to or greater than the first predetermined temperature; and
   a second comparator, wherein the voltage at the junction of the current source and the diode for temperature detection is provided to a non-inverting input, a voltage at a junction of the second resistor, and the third resistor is provided to an inverting input, and a signal is output when the detected-temperature is equal to or greater than the second predetermined temperature.

6. The semiconductor device as claimed in claim 4, wherein the current detector comprises:
   a first transistor and a first resistor that are connected in series between a first power source and a second power source;
   a second resistor, a third resistor, and a fourth resistor that are connected in series between a source of a reference voltage and the second power source; a first comparator, wherein a voltage at a junction of the first transistor and the first resistor is provided to a non-inverting input, a voltage at a junction of the third resistor and the fourth resistor is provided to an inverting input, and a signal is output when the detected current exceeds the first predetermined load current; and
   an operational amplifying circuit, wherein a voltage at a junction of the first transistor and the first resistor is provided to an inverting input, a voltage at a junction of the second resistor and the third resistor is provided to a non-inverting input, and a signal is output when the detected current exceeds the second predetermined load current.

7. The semiconductor device as claimed in claim 4, wherein the semiconductor device includes a plurality of the power circuits.

8. An electrical apparatus, comprising: the semiconductor device as claimed in claim 4.

9. The semiconductor device of claim 4, wherein
   a signal is provided to a current modification current when the detected temperature reaches the first predetermined temperature, and the detected current is greater than the first predetermined load current.

10. The semiconductor device of claim 9, wherein
    said signal changes when the detected temperature reaches a second predetermined temperature or when the detected current is greater than a second predetermined load current.

* * * * *